United States Patent
Farooq et al.

(10) Patent No.: US 6,178,082 B1
(45) Date of Patent: Jan. 23, 2001

(54) HIGH TEMPERATURE, CONDUCTIVE THIN FILM DIFFUSION BARRIER FOR CERAMIC/METAL SYSTEMS

(75) Inventors: Mukta S. Farooq; David E. Kotecki, both of Hopewell Junction; Robert A. Rita, Wappingers Falls; Stephen M. Rossnagel, Pleasantville, all of NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/031,236

(22) Filed: Feb. 26, 1998

(51) Int. Cl.$^7$ ...................................................... H01G 4/005
(52) U.S. Cl. .................. 361/303; 361/306.1; 361/321.1; 361/763
(58) Field of Search .............................. 361/306.1, 306.3, 361/306.2, 301.1, 301.2, 301.4, 303, 305, 309, 321.1–321.5, 763

(56) References Cited

U.S. PATENT DOCUMENTS

| | | | |
|---|---|---|---|
| 4,349,862 | * | 9/1982 | Bajorek et al. ........................ 361/401 |
| 4,407,007 | * | 9/1983 | Desai et al. ............................. 357/74 |
| 4,567,542 | | 1/1986 | Shimada et al. . |
| 4,954,877 | * | 9/1990 | Nakanishi et al. ...................... 357/80 |
| 5,043,223 | | 8/1991 | Kumagai et al. . |
| 5,065,275 | | 11/1991 | Fujisaki et al. . |
| 5,099,388 | | 3/1992 | Ogawa et al. . |
| 5,144,526 | | 9/1992 | Vu et al. . |
| 5,177,670 | * | 1/1993 | Shinohara et al. ..................... 361/388 |
| 5,258,236 | | 11/1993 | Arjavalingam et al. . |
| 5,504,041 | * | 4/1996 | Summerfelt ........................... 437/235 |
| 5,617,290 | * | 4/1997 | Kulwicki et al. .................. 361/321.4 |
| 5,854,534 | * | 12/1998 | Beilin et al. .......................... 257/691 |
| 5,874,369 | * | 2/1999 | Farooq et al. ........................ 438/940 |

OTHER PUBLICATIONS

Applied Surface Science, 53, "Amorphous Ta–Si–N Diffusion Barriers in Si/Al and Si/Cu Metallizations", Apr. 30, 1991, pp. 373–376.

J. Electrochem Soc., "Amorphous Ternary Ta–Si–N Diffusion Barrier Between Si and Au", vol. 138, No. 7, Jul. 1991, pp. 2125–2129.

J. Appl. Physics 70 (5), "Thermal Oxidation of Amorphous Ternary $Ta_{36}Si_{14}N_{50}$ Thin Films", Sep. 1, 1991, pp. 2828–2832.

* cited by examiner

*Primary Examiner*—Kristine Kincaid
*Assistant Examiner*—Eric Thomas
(74) *Attorney, Agent, or Firm*—DeLio & Peterson LLC; John J. Tomaszewski; Aziz M. Ahsan

(57) ABSTRACT

A multilayer ceramic substrate having a thin film structure containing capacitor connected thereto is provided as an interposer capacitor, the capacitor employing platinum as the bottom electrode of the capacitor. In a preferred capacitor, a dielectric material such as barium titanate is used as the dielectric material between the capacitor electrodes. The fabrication of the interposer capacitor requires an in-situ or post deposition high temperature anneal and the use of such dielectrics requires heating of the capacitor structure in a non-reducing atmosphere. A layer of a high temperature, thin film diffusion barrier such as TaSiN on the lower platinum electrode between the electrode and underlying multilayer ceramic substrate prevents or minimizes oxidization of the metallization of the multilayer ceramic substrate to which the thin film structure is connected during the fabrication process. A method is also provided for fabricating an interposer capacitor with a multilayer ceramic substrate base and a thin film multilayer structure having at least one capacitor comprising at least one bottom platinum electrode.

15 Claims, 1 Drawing Sheet

HIGH TEMPERATURE, CONDUCTIVE THIN FILM DIFFUSION BARRIER FOR CERAMIC/METAL SYSTEMS

BACKGROUND OF THE INVENTION

1. Field of the Invention

The present invention relates to multilayer electronic components and, in particular, to interposer thin film containing capacitors which use a noble metal such as platinum, iridium, palladium, ruthenium, silver, gold, etc. or alloys thereof as a capacitor electrode and to a diffusion barrier material (such as TaSiN, TiN, TaN, TiAlN, etc.) used in combination with the electrode to minimize circuitry oxidation and to provide an enhanced electronic component.

2. Description of Related Art

Multilayer substrates with capacitors have found wide spread use in electronics as integrated circuit packages. Electronic components are being made smaller in size with a higher circuit density and to meet these requirements it is necessary to use fabrication materials having enhanced properties such as increased conductivity, higher dielectric constant values, etc. Many of these materials however, do not have properties which enable their use with the other components of the multilayer substrate and accordingly, their use is limited in the fabrication of multilayer electronic components.

Ceramics have found widespread use in electronics as a substrate for integrated circuit packages including multilayer ceramic substrates having inner capacitors. In general, a metallized circuit pattern is applied to the ceramic substrate which is in the form of a greensheet, and the greensheet stacked with other metallized greensheets and the stack sintered to create a monolith of substrate and circuitry. Multilayer circuit packages are constructed by combining ceramic particles and organic binders into unfired or "greensheet" tape. Interlayer conductive pads, known as "vias", are then inserted (punched) through the layer, and the vias filled with metals (Mo, Cu, W, etc.) forming electronic interconnections between the circuits. Metallized circuit patterns are then applied to the punched greensheet as is well known in the art and the layers stacked and sintered.

A capacitor can be formed within the multilayer substrate by sandwiching an inner dielectric layer between a pair of electrodes. Conductive pads are formed on the top sheet and wirings are formed within the substrate to connect the capacitor electrodes to the pads. U.S. Pat. Nos. 4,567,542; 5,065,275; 5,099,388 and 5,144,526 show such multilayer ceramic (MLC) products having internal capacitors and the disclosure of these patents are hereby incorporated by reference.

A capacitor structure can alternately be formed by using thin films of electrodes and dielectrics which are deposited on a prefabricated multilayer ceramic substrate. Typically, the bottom electrode is deposited using such techniques as sputter deposition, evaporation, chemical vapor deposition or sol-gel. The electrode is made from a noble metal (Pt, In, Ru, Pd, Ag—Pd, Au) or a noble metal oxide ($IrO_2$, $RuO_2$, etc.). The electrode may then be subjected to patterning by employing a photoresist stencil to define the pattern followed by wet or dry etching to delineate areas and thus create the pattern. This step is followed by deposition of the dielectric material using a physical or chemical vapor deposition method, or other techniques such as a spin-on technique. An example of films applied wet is a sol-gel film or other organic medium film which is heat treated leaving the inorganic dielectric component. The dielectric film may require one or more heat treatments in specific ambients such as oxidizing atmospheres to arrive at desired stoichiometries. An example of a dielectric film is barium titanate (BT), barium strontium titanate (BST) or barium zirconate titanate (BZT). These films can be deposited using a sputter deposition technique which employs an appropriate target in the presence of argon plasma, metallorganic chemical vapor deposition or sol-gel processing.

The dielectric film may then be patterned using a resist stencil and dry or wet etching methods. The final step is to put down the top electrode, which is typically selected from the above list of materials used for the bottom electrode, using methods such as those described above.

Platinum and other such desirable capacitor electrode materials are not an effective barrier in thin film components to the diffusion of oxygen in the temperature range used to fabricate the component. Oxygen moves readily through the platinum and oxidizes underlying vias and other circuitry wiring in the multilayer ceramic substrate which vias and circuitry may be made of Mo, Cu, W, etc. This oxidization results in either an electrical opening or a higher resistance path for the electrical signal, both of which are unacceptable.

Bearing in mind the problems and deficiencies of the prior art, it is therefore an object of the present invention to provide a multilayer ceramic electronic component containing thereon a thin film postfire capacitor having a noble metal electrode such as platinum, iridium, palladium, ruthenium, silver, gold, etc. which component has enhanced electrical integrity and operating characteristics.

It is another object of the present invention to provide a method for forming an electronic component comprising a multilayer ceramic containing thereon a thin film postfire capacitor having a noble metal electrode which component has enhanced electrical integrity and operating characteristics.

Still other objects and advantages of the invention will in part be obvious and will in part be apparent from the specification.

SUMMARY OF THE INVENTION

The above and other objects and advantages, which will be apparent to one skilled in the art, are achieved in the present invention which is directed, in a first aspect, to an electronic component structure comprising:

a multilayer ceramic substrate comprising a plurality of ceramic layers having thereon metallized circuitry, interconnecting metallized vias and bottom to top vias;

a thin film structure electrically connected to the multilayer ceramic substrate, the thin film structure containing at least one capacitor comprising at least one lower first electrode comprising a layer of platinum or other noble metal and an upper second metal electrode with a dielectric material therebetween with each electrode layer being connected by wiring from the respective electrode to a corresponding pad on the surface of the thin film structure; and a barrier layer of preferably TaSiN on the lower surface of the lower first electrode which barrier layer is between the platinum or other noble metal and the underlying metallized vias and circuitry.

In another aspect, the present invention relates to a method for fabricating an electronic component structure comprising:

forming a multilayer ceramic substrate by stacking layers of greensheets having metallization thereon and metal containing via interconnections and bottom to top vias and sintering the stack; and forming a thin film structure on the surface of the multilayer ceramic substrate, the thin film structure containing at least one capacitor within said thin film structure comprising a first layer of platinum or other noble metal as a lower first electrode, a dielectric material layer formed on the surface of the platinum or other noble metal and an upper second layer of conductive metal on the surface of the dielectric as a second electrode, the first electrode and second electrode being connected to respective pads on the surface of the thin film structure by separate wirings from each electrode, the platinum (noble metal) first electrode having a barrier layer of preferably TaSiN deposited on the lower surface of the first electrode between the platinum (noble metal) and the underlying metal vias and metallized circuitry.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which:

DESCRIPTION OF THE PREFERRED EMBODIMENT(S)

Figure 1:
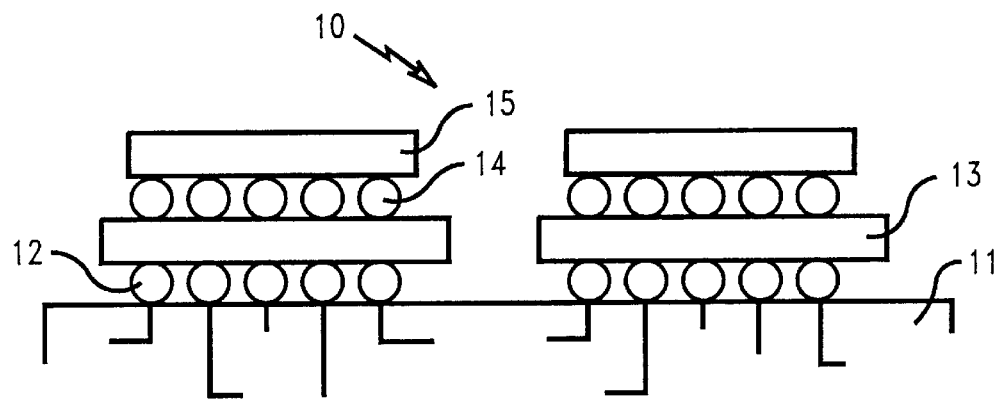
FIG. 1 shows a schematic of an interposer capacitor connected by C4 solder connections to a chip and to a multilayer ceramic substrate or other electronic component substrate.

In describing the preferred embodiments of the present invention, reference will be made herein to FIGS. 1–2 of the drawings in which like numerals refer to like features of the inventions. Features of the invention are not necessarily shown to scale in the drawings.

Referring to FIG. 1, an electronic component employing an interposer capacitor of the invention is shown generally as 10. A multilayer ceramic or other electronic component substrate 11 such as a printed wiring board is shown electrically connected to interposer capacitor 13 by C4 solder bumps 12. The interposer capacitor 13 is also electrically connected to chip 15 by C4 solder bumps 14. The electronic component 10 may include microprocessors, SRAMS, DRAMS and chips.

The component 10 may be assembled using known fabrication techniques such as the C4 solder bumps shown in FIG. 1. This technology is very well-known and need not be discussed herein except that the order of fabrication of electronic component 10 will generally be C4 solder connection of the interposer capacitor to the multilayer ceramic substrate 11 followed by C4 solder bump connection of the chip 15 to the interposer capacitor 13.

The fabrication of a multilayer thin film structure is also well known in the art. In general, the multilayer thin film structure comprises a plurality of dielectric layers which include wiring patterns such as pads, straps, vias, electrodes, etc. The multilayer thin film structure is built layer-by-layer and each layer is typically made as follows. A dielectric material such as polyimide or epoxy is applied and a via defined for further interconnection. The via may be formed by laser or by photolithography techniques. A seed plating layer is applied on top thereof and a photoresist material then applied and exposed to define the desired wiring pattern. After developing, a metal such as copper is electroplated to form the wiring. The photoresist material and seed layer is then stripped. This is generally termed a lithography or photolithography process and may be used for additive or subtractive metallization procedures as is well-known in the art, e.g., as described in U.S. Pat. No. 5,258,236, which is incorporated herein by reference. The above procedure is continued for each layer until the thin film structure is completed.

Figure 2:
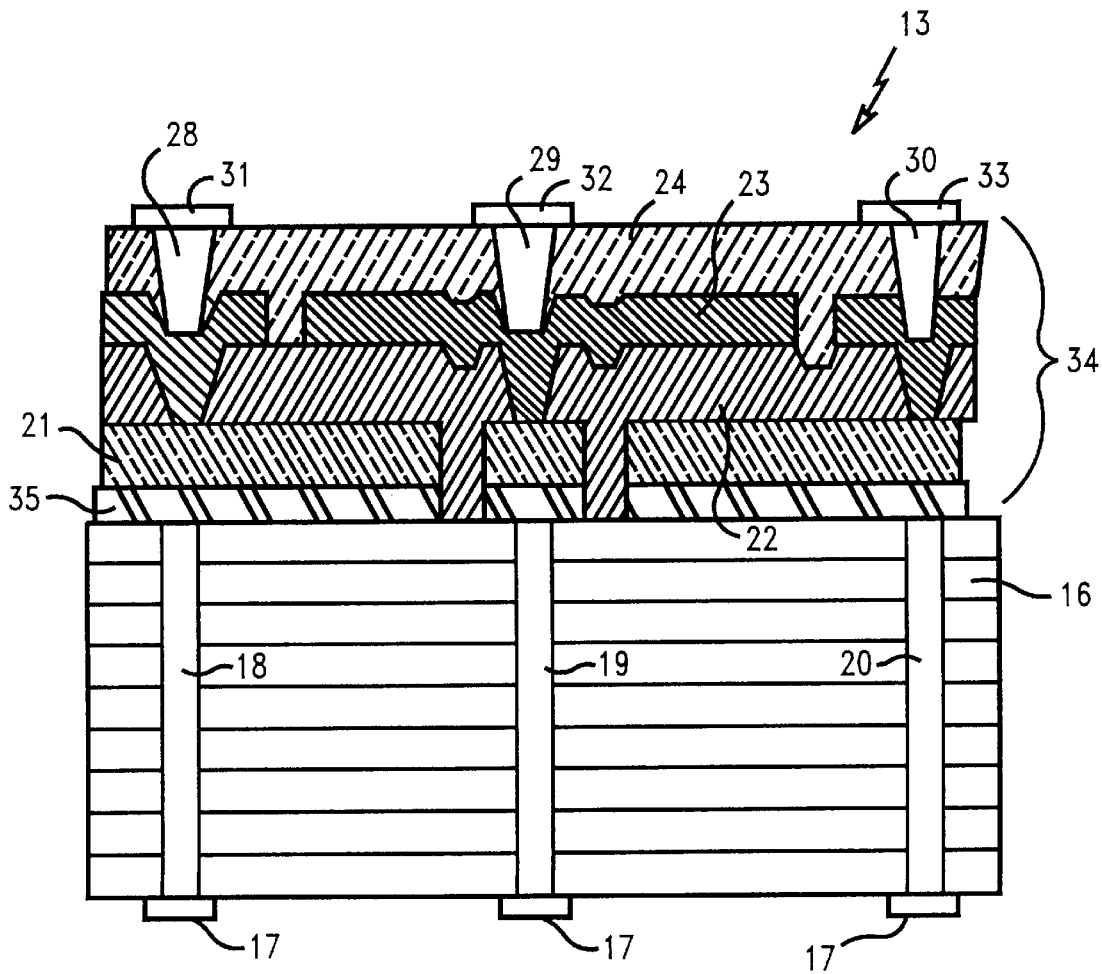
FIG. 2 shows a schematic of an interposer capacitor of the invention.

Referring now to FIG. 2, an interposer capacitor of the invention is shown generally as 13. The interposer capacitor 13 comprises a multilayer ceramic substrate base 16 (shown for clarity as a single layer) on which the thin film capacitor is fabricated. The multilayer ceramic substrate 16 has through vias 18, 19 and 20 where 18 is a ground via connection, 19 is a power via connection and 20 is a signal via connection. Pads 17 on the lower surface thereof are used to electrically connect the interposer capacitor 13 to a substrate 11 as in FIG. 1 by C4 solder connectors 12.

The thin film structure containing a capacitor is shown generally as 34 and is carried on the surface of the multilayer ceramic substrate 16. The thin film multilayer structure 34 has a lower bottom electrode 21. The electrode 21 is shown as a single layer but is typically a composite and is preferably platinum having a TaSiN barrier layer 35 on the lower surface thereof. Such a composite layer is disclosed by M. Farooq, et al. in co-pending application Docket No. FI9-97-260 entitled "STRUCTURE AND METHOD FOR A THIN FILM MULTILAYER CAPACITOR", filed on even date herewith, the disclosure of which is hereby incorporated by reference. A high K dielectric material 22 separates platinum electrode 21 from the top electrode 23 of the capacitor. Top electrode 23 may also be platinum or any other suitable metal such as iridium, ruthenium, palladium, gold silver or alloys thereof or conductive oxides like $RuO_x$ and $IrO_x$. The top electrode 23 is overlaid with a polymer layer 24. Pads 31, 32 and 33 which overlay vias 28, 29 and 30, respectively, will be connected by C4 solder bumps to a chip as shown in FIG. 1. Any suitable terminator metallurgy can be used.

In the multilayer ceramic substrate 16, three vias are shown as 18, 19 and 20. These vias go from the bottom of the multilayer ceramic substrate 16 to the top of the multilayer ceramic substrate 16 and interconnect the substrate 11 on which the interposer capacitor will be electrically connected to the thin film structure of the interposer capacitor.

It has been found that the use of a TaSiN barrier layer 35 on the bottom surface of lower electrode 21 of the capacitor is an effective barrier in preventing the oxygen in the ambient from reaching the underlying molybdenum or other metal vias or circuitry below the barrier layer during fabrication of the high K dielectric thin film structure thus preventing or at least minimizing oxidization of the vias such as 18, 19 and 20. This is especially important in thin film structures containing an inner capacitor made using a dielectric such as barium titanate or other such dielectric material layer including BZT (barium zirconiate titanate), BST (barium strontium titanate), PLZT (lead lanthanum zirconate titanate), PZT (lead zirconate titanate), tantalum oxide, etc. for which a reducing atmosphere cannot be used to connect the interposer capacitor structure to the multilayer ceramic substrate. The TaSiN barrier layer material is also conductive which is a requirement for use in such components.

The stoichiometric composition of TaSiN is preferably about 0.3 tantalum, 0.3 silicon and 0.4 nitrogen (atom fractions). The compositions can vary to some extent provided that the silicon fraction remains above about 0.15 and preferably above about 0.27. It has also been found, and is an important aspect of the invention, that the contact resistance of the platinum/TaSiN interface is very low and does not create any significant problem in the signal transmittal at that interface. In some cases the TaSiN barrier layer can be used directly as a bottom electrode eliminating the need for a platinum electrode. However, for most applications, the platinum layer containing a planar TaSiN barrier layer is preferred in forming the inner capacitor of the multilayer ceramic product of the invention. The TaSiN barrier layer may vary in thickness from about 50 Å to 5000 Å, preferably about 1000 Å to 2500 Å, e.g., about 2000 Å. The platinum layer is typically about 2000 Å thick but may also vary widely such as about 500 to 10,000 Å.

The barrier layer may also be any suitable low resistant inert conductive material such as tantalum nitride, silicon nitride, tantalum silicon nitride, titanium nitride and tungsten nitride, silicides, etc. TaAlN is preferred.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An interposer capacitor comprising:
    a multilayer ceramic substrate comprising a plurality of ceramic layers having therein metallized circuitry, interconnecting metallized vias and bottom to top vias;
    a thin film structure electrically connected to the multilayer ceramic substrate, the thin film structure containing at least one capacitor comprising at least one lower first electrode comprising a layer of first conductive material and an upper second electrode comprising a layer of second conductive material with a dielectric material therebetween with each electrode layer being connected by wiring to a corresponding pad on the surface of the thin film structure; and a barrier layer on the lower surface of the first conductive material, the barrier layer being between the first conductive material and the vias and metallized circuitry of the multilayer ceramic substrate.

2. The structure of claim 1 wherein the barrier layer comprises conductive materials, silicides or other low resistance inert materials.

3. The structure of claim 1 wherein the barrier layer is selected from the group consisting of tantalum silicon nitride, tantalum aluminum nitride, titanium silicon nitride, titanium nitride, tantalum nitride, tungsten nitride and titanium aluminum nitride.

4. The structure of claim 1 wherein the conductive materials are selected from the group consisting of platinum, iridium, ruthenium, palladium, gold, silver or alloys thereof or conductive oxides RuOx and IrOx.

5. The structure of claim 1 wherein the lower electrode comprises the layer of first conductive material and the barrier layer.

6. The structure of claim 1 wherein the dielectric material is selected from the group consisting of barium titanate, barium strontium titanate, strontium titanate, barium zirconate titanate, lead lanthanum zirconate titanate, lead zirconate titanate or tantalum oxide.

7. The Structure of claim 1 wherein the barrier layer is about 50 to 5000 Å thick.

8. A multilayer electronic component comprising a lower electronic component and an upper electronic component which are electrically connected by the interposer capacitor of claim 1.

9. A method for fabricating an interposer capacitor comprising:
    forming a thin film structure on the surface of a multilayer ceramic substrate having metallization therein, metal containing via interconnectings and bottom to top vias, the thin film structure containing at least one capacitor within said thin film structure comprising a first layer of conductive material as a lower first electrode, a dielectric material layer formed on the upper surface of the first electrode and an upper second layer of conductive material on the surface of the dielectric as a second electrode, the first electrode and second electrode being connected to corresponding pads on the surface of the thin film structure by separate wirings from each electrode, the lower first electrode having a barrier layer on the lower surface of the first electrode between the first electrode and the vias and metallization of the multilayer ceramic substrate.

10. The method of claim 9 wherein the barrier layer comprises conductive materials, silicides or other low resistance inert materials.

11. The method of claim 9 wherein the barrier layer is selected from the group consisting of tantalum silicon nitride, tantalum aluminum nitride, titanium silicon nitride, titanium nitride, tantalum nitride, tungsten nitride and titanium aluminum nitride.

12. The method of claim 9 wherein the conductive materials are selected from the group consisting of platinum, iridium, ruthenium, palladium, gold, silver or alloys thereof or conductive oxides RuOx and IrOx.

13. The method of claim 9, wherein the lower first electrode comprises the layer of first conductive material and the barrier layer.

14. The method of claim 8 wherein the dielectric material is selected from the group consisting of barium titanate, barium strontium titanate, strontium titanate, barium zirconate titanate, lead lanthanum zirconate titanate, lead zirconate titanate or tantalum oxide.

15. The method of claim 9 wherein the barrier layer is about 50 to 5000 Å thick.

* * * * *